United States Patent [19]

Erickson et al.

[11] Patent Number: 5,081,433
[45] Date of Patent: Jan. 14, 1992

[54] TWO STATE PHASE MODULATOR WITH MINIMUM AMPLITUDE MODULATION

[75] Inventors: Bert K. Erickson, Fayetteville; George C. Rosys, North Syracuse; John F. Jureller; Victor J. Jacek, both of Syracuse, all of N.Y.

[73] Assignee: General Electric Company, Syracuse, N.Y.

[21] Appl. No.: 620,667

[22] Filed: Dec. 3, 1990

[51] Int. Cl.⁵ .............................................. H03C 3/00
[52] U.S. Cl. ..................................... 332/103; 332/144
[58] Field of Search ............... 332/103, 144, 145, 146, 332/147, 148

[56] References Cited

U.S. PATENT DOCUMENTS 3,037,190  5/1962  Herbst ........................... 332/103 X
4,549,152  10/1985  Kumar ................................. 332/144
4,730,344  3/1988  Saha ................................ 332/103 X

*Primary Examiner*—Robert J. Pascal
*Attorney, Agent, or Firm*—Richard V. Lang; Paul Checkovich; Fred Jacob

[57] ABSTRACT

The invention relates to a two state phase modulator with minimum amplitude modulation. The modulator assumes two phase states differing by $\Theta$ where $\Theta$ is a sub-multiple of 180° which permits a phase variation of 180° for phase coded transmissions when the frequency of the phase modulated carrier wave is multiplied by the reciprocal of the sub-multiple. Three equal components are derived in the phase modulator: an in-phase, an out of phase, and a quadrature phase component. The out of phase component is delayed in relation to the in-phase component by $\Theta/2$, while the quadrature phase component is delayed $\Theta/4$. The in-phase and out of phase components are then reduced by a factor ($2 \sin \Theta/2$) selected such that when added to the quadrature component, the resultants have a magnitude equal to that of the quadrature component and differ in phase from the quadrature comonent by $\pm\Theta/2$. The modulator output is formed of the resultants supplied in alternation with the quadrature component at zero phase being supplied during the transitions. Amplitude variation during the phase modulation process is reduced to a fraction of a decibel.

9 Claims, 2 Drawing Sheets

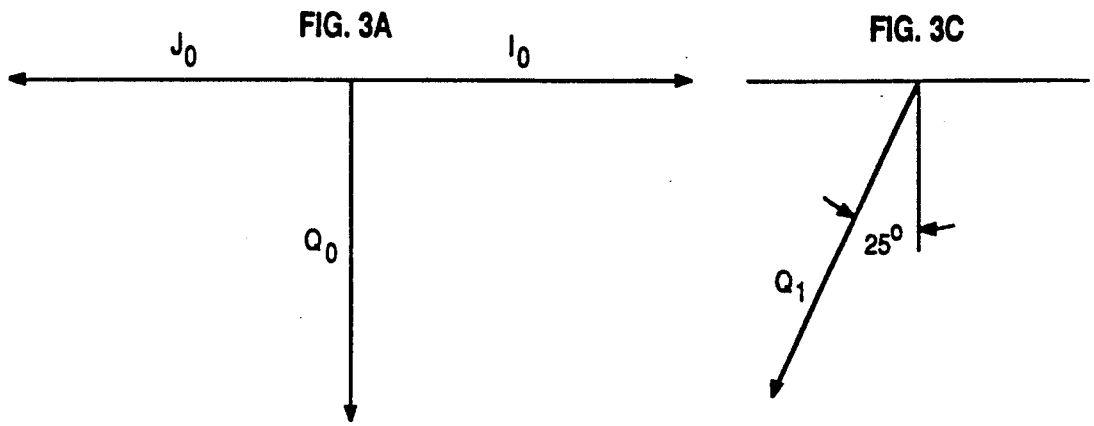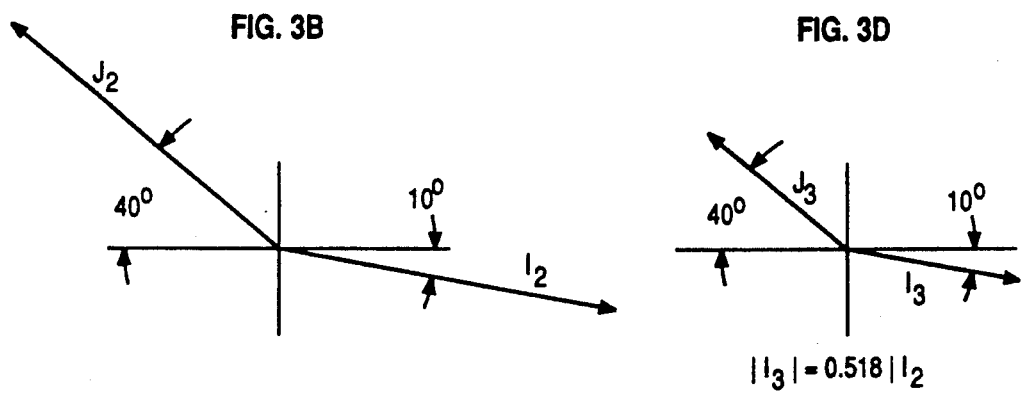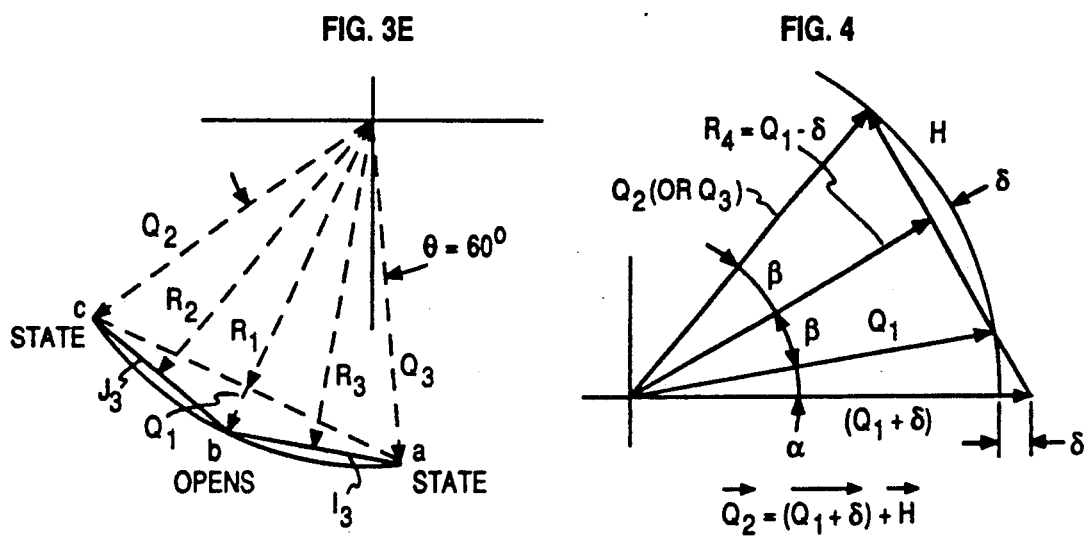

TWO STATE PHASE MODULATOR WITH MINIMUM AMPLITUDE MODULATION

The United States Government has rights in this invention pursuant to Contract No. N00024-88-C-5407, awarded by the United States Navy.

BACKGROUND OF THE INVENTION

1. Field of the Invention

The invention relates to phase modulators which are operated between two phase states, and more particularly to a phase modulator suitable for use in a frequency multiplication chain to produce an in-phase state (i.e. at 0° reference phase) and an out of phase state (i.e. 180° from reference phase) upon a carrier wave, or equivalently ±90° from reference phase.

2. Prior Art

Phase modulators have been used for some time to provide phase coding in a transmitted wave. In radar systems, the phase modulation will assume an in-phase state, corresponding to a "1" and an out of phase state corresponding to a "0". (The two phase states may also be regarded as plus or minus 90° from a reference phase state.) The duration of one bit of the phase coding is typically many cycles, 200 nanoseconds in a typical system, and it is desirable that the change in phase state take place in a relatively short duration, typically 20 nanoseconds.

In a typical phase modulation system, there is frequently a very significant variation in amplitude during the transition from one phase state to the other. In a known bi-phase modulator circuit, the amplitude of the carrier is reduced 23 dB in the transition from one phase state to the other phase state, and then reduced again by 23 dB in the transition from the other phase state back to the original phase state.

This very substantial amplitude modulation produces a number of undesirable side effects in the utilization circuitry, and for that reason efforts have been directed to reducing the amplitude modulation to a much lower level. One such approach has been to allow the phase modulation to produce a small fraction of the ±90° phase modulation on a low frequency carrier, after which the carrier is multiplied by the reciprocal of the fraction to achieve ±90° phase modulation in the final high frequency carrier. In a known example, reducing the phase modulation to ±45° and multiplying the frequency by a factor of two reduces the amplitude variation to approximately 1.5 dB. Reducing the phase modulation angle to approximately ±22.5° reduces the amplitude modulation to approximately 0.6 dB and requires that the frequency be multiplied by a factor of four.

The approach of reducing the phase modulation angle and multiplying the frequency to get ±90° phase modulation at the final carrier frequency with rectangular phasor combinations is accordingly useful, however these combinations can be modified using some of the same components to reduce the residual ripple even more.

SUMMARY OF THE INVENTION

Accordingly it is an object of the present invention to provide an improved phase modulator for switching between two phase states.

It is another object of the present invention to provide a phase modulator for switching between two phase states in which amplitude modulation is greatly reduced.

It is still another object of the present invention to provide a phase modulator of an economic design for switching between two phase states with minimum amplitude modulation.

These and other objects of the invention are achieved in a novel phase modulator which may be switched between two phase states with an angular separation of $\Theta$. The phase modulator comprises means to form three carrier frequency waves of equal magnitude, respectively wave $I_o$ which is at reference phase; wave $Q_o$ which is in phase quadrature ($-90°$); and wave $J_o$ which is out of phase ($-180°$). These three waves are formed by a first quadrature hybrid ($HY_1$) connected for power division, the in-phase output of which produces the wave $I_o$, a second quadrature hybrid ($HY_2$), supplied from the quadrature output of the first hybrid ($HY_1$), and which is also connected for power division, and which derives the waves $J_o$ and $Q_o$. The in-phase wave from hybrid $HY_1$ is supplied to a 3 dB attenuator ($ATT_1$) to equalize the magnitude of $I_o$ to $J_o$ and $Q_o$, making all three equal.

The wave $J_o$ is next delayed in relation to the wave $I_o$ by one half the phase modulation angle ($\Theta$), and the two waves, now denominated $I_2$ and $J_2$ are coupled to the first and second terminals of a single pole double throw switch, which selects one for transmission to a second attenuator $ATT_2$.

The second attenuator $ATT_2$ is provided to bring the waves $I_2$ and $J_2$ into a prescribed magnitude relationship to $Q_o$ prior to addition in a summation hybrid $HY_3$. This entails reducing the magnitudes of the waves $I_2$ and $J_2$ by a factor of at least $2(\sin \Theta/2)$, the attenuated waves being denominated $I_3$ and $J_3$.

The wave $Q_o$ from hybrid $HY_2$ is now coupled to a delay line designed to bring the resulting phase shifted wave $Q_1$ into the prescribed phase with the waves $I_3$ and $J_3$. Assuming a first order correction, the summation hybrid forms two congruent isosceles triangles from the component phasors whose central angle is $\Theta/2$. In one triangle, the equal sides are phasors $Q_1$ and $Q_2$ with $Q_2$ being formed by addition of phasors $Q_1$ and $J_3$, and in the other triangle the equal sides are phasors $Q_1$ and $Q_3$ with $Q_3$ being formed by the addition of phasors $Q_1$ and $I_3$. In the case where $\Theta$ is 60° (and eventual multiplication by three is contemplated), the central angle of the isosceles triangle is 30° and the angle between $Q_1$ and $J_3$ and between $Q_1$ and $I_3$ in the summation diagram is 75°.

The effect of the foregoing geometrical relationship is that as the phase is being changed from one state to the other, the first phasor (e.g. $Q_2$) which represents the in-phase output wave has a magnitude equal to $Q_1$, and after the phase has changed, the second phasor (e.g. $Q_3$) which represents the phase shifted output wave also has a magnitude equal to phasor $Q_1$. Since the wave represented by the phasor $Q_1$ is continuously supplied, the output wave also has a magnitude equal to the phasor $Q_1$ at the mid point of the transition between phase states. The effect is to reduce the amplitude ripple in the output wave to two shallow valleys, less than a fraction of a dB (e.g. 0.301 dB) as the modulator is switched between ±30°. If $\Theta$ is selected to be 45°, for eventual multiplication by four, the ripple is reduced by almost one-half (e.g. 0.169 dB).

The summation hybrid may either be a quadrature hybrid or an in-phase hybrid provided that the required symmetry between the phasors $Q_1$, $I_3$ and $J_3$ for addition is preserved. The in-phase hybrid may be preferred because of a reduction in the delay required of the phasor $Q_1$.

A somewhat smaller ripple may be achieved if the continuously supplied wave represented by the phasor ($Q_1$) is made larger than the phasor resultants $Q_2$ and $Q_3$ by the error $\delta$ which exists at the valleys. This equal ripple adjustment, if an increase in the phasor $Q_1$ relative to the resultants $Q_2$ and $Q_3$ can be tolerated, further reduces the ripple in the case where $\Theta = 60°$ to approximately 0.2 dB and in the case where $\Theta = 45°$ to approximately 0.1 dB.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

FIGS. 3A through 3E are phasor diagrams of the voltages at specific nodes in the phase modulator of FIG. 1, corresponding to an adjustment in which amplitude modulation is minimized in transitioning between phase states by a first order correction; and FIG. 4 is a phasor diagram illustrating an equal ripple amplitude adjustment of the FIG. 1 embodiment in which a further reduction in amplitude modulation between phase states is achieved.

DESCRIPTION OF THE PREFERRED EMBODIMENT

Figure 1:
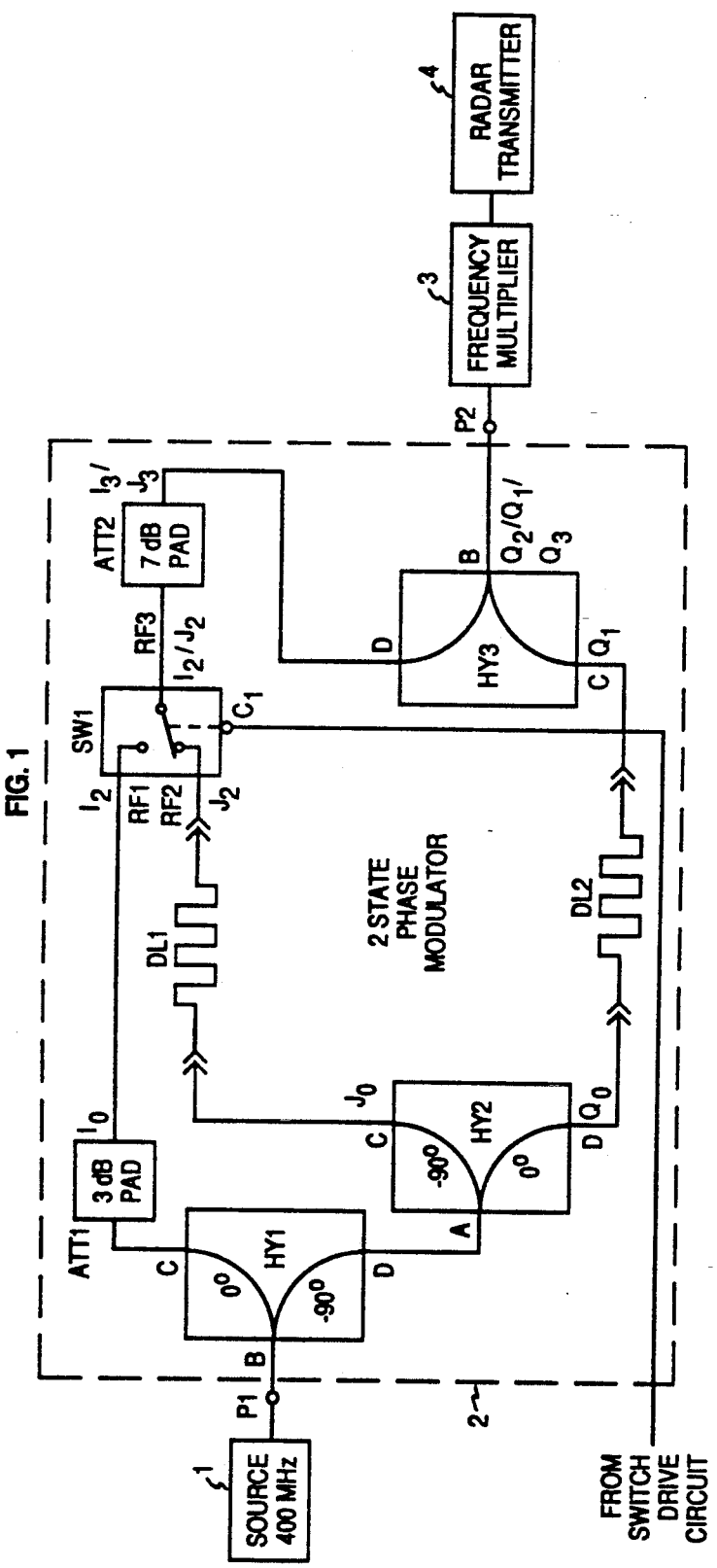
FIG. 1 is a simplified block diagram of a phase modulated CW radar system containing a novel two state phase modulator which exhibits minimum amplitude modulation in transitioning between phase states.

FIG. 1 is a simplified block diagram of a phase modulated CW radar system containing a novel two state phase modulator in which amplitude variation is reduced between the two phase states and in the transition between states.

The PM CW radar system includes a source 1 of a 400 MHz CW carrier wave, and the two state phase modulator 2, which produces a phase modulation of 22.5° in one state and of −22.5° in another state or a phase difference of 45° between states. The radar system further includes a frequency multiplier (3) which multiplies the carrier frequency by a factor of four, which has the effect of multiplying the phase difference by a factor of four, to produce a "1" state at reference phase and a "0" state delayed 180° (i.e. at −180°) from reference phase. The multiplier supplies the digitally phase modulated carrier to the radar transmitter (4). A multiple of four was used for the frequency multiplier because it is easier to make using even numbered multipliers. However for purposes of illustration, a 30° angle will be used in the following description and it will require multiplication by a factor of three.

Figure 2:
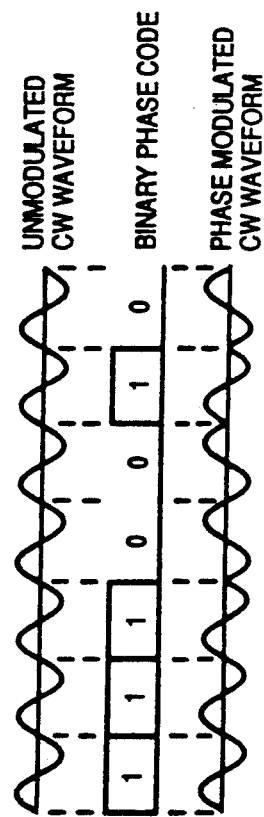
FIG. 2 shows waveforms descriptive of the output of a phase modulated CW radar system.

The phase coding is illustrated in FIG. 2. The phase is digitally encoded into "bits" of 250 nanosecond duration, and thus there are tens of waves (e.g. 100), the exact number depending upon the carrier frequency, (which are not individually illustrated) during each coding bit. The unmodulated CW waveform which is the uppermost waveform in FIG. 2 shows a single sinusoid for each bit rather than the higher number actually transmitted. The binary phase coding is illustrated immediately below. In the example, the binary sequence is 1110010 (reading from left to right). The phase coded waveform (going from left to right) includes three digital bits in which each RF cycle is of reference phase, two digital bits in which each RF cycle is 180° out of phase, a single bit in which each RF cycle is of reference phase, and a last single bit in which each RF cycle is 180° out of phase.

While a large number of cycles of the carrier are being transmitted during each phase encoded bit, it is desirable that the waves during both states be of equal amplitude and that the amplitude not change significantly in the relatively fast ($\sim$20 nanosecond) transitions between states. The phase modulator illustrated in FIG. 1 preserves this constancy of amplitude to a high degree.

The novel two state phase modulator, illustrated in FIG. 1, which produces minimum phase modulation, comprises as its principal elements three reciprocal hybrids ($HY_1$, $HY_2$ and $HY_3$), two attenuators ($ATT_1$, $ATT_2$), two delay lines ($DL_1$, $DL_2$), and a GaAs SPDT MMIC switch ($SW_1$). These elements are interconnected as shown in FIG. 1, and the waveforms at the critical nodes of the FIG. 1 diagram are illustrated in FIGS. 3A-3E.

As a first step in producing the two phase states, the hybrids $HY_1$ and $HY_2$, which are quadrature hybrids and the attenuator $ATT_1$ of the phase modulator are arranged to derive three waves of equal magnitude respectively at reference phase (0°); out of phase (−180°) and in quadrature phase (−90°) from the unmodulated 400 MHz carrier supplied from the source 1. The three waves are represented in FIG. 3A by the phasors $I_o$, $J_o$ and $Q_o$ respectively.

As shown in FIG. 1, the 400 MHz carrier wave from the source 1 is coupled to the phase modulator input terminal $P_1$, which is connected to the B port of the quadrature hybrid $HY_1$. The hybrid $HY_1$, a reciprocal device, is connected for power division. The A port of the hybrid $HY_1$, which is not shown, is terminated. The wave supplied to the B port is propagated with approximately equal (3 dB) power division to the output ports C and D. The wave propagated to the in-phase port C is at nominally at reference phase (0°), and the wave propagated to the quadrature port D is nominally at −90° from reference phase. There is, of course, some accumulated delay for both waves in passage through the hybrid.

Continuing, the wave at the quadrature port D of the hybrid $HY_1$ is then coupled to the A port of the quadrature hybrid $HY_2$, also connected for power division. The B port of the hybrid $HY_2$, which is not shown, is terminated. The wave supplied to the A port is propagated with an approximately equal (3 dB) power division to the output ports C and D. The wave propagated to the in-phase port D is nominally at reference phase (0°) in hybrid $HY_2$ while the wave propagated to the quadrature port C, and which experiences a second delay of −90° in hybrid $HY_2$, is nominally out of phase (−180°) with respect to reference phase.

The waves appearing at the C and D ports of the hybrid $HY_2$, are of equal magnitude but, having experienced a second power division both are of reduced amplitude in relation to the wave appearing at the C port of the hybrid $HY_1$, which has experienced only one power division. The wave appearing at the C port of the hybrid $HY_1$ is coupled to the 3 dB attenuator $ATT_1$ to bring it into equality with the other two waves at the C and D ports of HY$_2$. Thus three waves of equal magnitude, respectively nominally in-phase (0°), out of phase (−180°) and in quadrature phase (−90°) are created.

These three waves, now denominated "I$_o$", "J$_o$", "Q$_o$" have been indicated at the respective circuit nodes where they appear in FIG. 1. They are also shown, using conventional phasor notation, in FIG. 3A. In particular, the wave I$_o$ at the output of attenuator ATT$_1$ is nominally at reference phase; the wave J$_o$ at the port C of hybrid HY$_2$ is nominally out of phase (−180° from reference phase), while the wave Q$_o$ at the D port of hybrid HY$_2$ is nominally at quadrature phase (−90° from reference phase), and all three phasors are of substantially equal magnitude.

As a second step in producing the two phase states, the delay line DL$_1$, the GaAs MMIC switch SW$_1$, and the 7 dB attenuator ATT$_2$ are arranged to derive two alternately available waves I$_3$/J$_3$ from the waves I$_o$ and J$_0$. (As will be shown, the waves I$_3$/J$_3$ are then combined in the hybrid HY$_3$ with a third wave derived from the wave Q$_o$ to form the two phase states of the phase modulator 2.)

Assuming that the two phase states of the phase modulator will alternate between plus or minus 30°, the phasor J$_o$ is delayed 30° with respect to the phasor I$_o$ prior to application to the switch SW$_1$. In addition to the stated 30° differential delay, both phasors are subject to an incidential 10° delay. The switch SW$_1$, which is electrically equivalent to a single pole double throw (SPDT) switch, is of a GaAs MMIC design having two fixed terminals RF$_1$ and RF$_2$, and a common terminal RF$_3$ selectively connected to the first or the second terminal in response to a control signal from a driver circuit.

The phasors coupled to the fixed terminals RF$_1$ and RF$_2$ of the switch are denominated I$_2$ and J$_2$, respectively, the subscripts indicating the change in-phase that the two phasors have experienced. The phasors denominated I$_2$ and J$_2$ have been indicated at the respective circuit nodes where they appear in FIG. 1. They are also shown in FIG. 3B, using conventional phasor notation.

The solid state switch SW$_1$ is operated between the two conductive states by the application of a control potential. The drive circuit, which applies the control potential to terminal C$_1$ of switch 1, is timed such that conduction is being terminated between terminals RF$_1$ and RF$_3$ as conduction is being initiated between terminals RF$_2$ and RF$_3$.

Thus the waveforms appearing at the common terminal RF$_3$, alternate between I$_2$ and J$_2$. Assuming a rise time for initiating conduction comparable to the fall time for terminating conduction, the phasors transition simultaneously with rise/fall times on the order of 20 nanoseconds.

After passage through the SPDT switch SW$_1$, the two alternately available waveforms I$_2$ and J$_2$, are coupled to the attenuator ATT$_2$ which produces an attenuation set exactly equal to 2(sin Θ/2) times the unit phasor (e.g. Q$_o$), for a first order correction of the amplitude modulation. The angle Θ is 30°, assuming that the output states of the phase modulator are ±30°.

The new phasors I$_3$/J$_3$ in the case of ±30° phase modulation are thus reduced by a factor of 0.518. They appear at the output node of the attenuator ATT$_2$, and are illustrated in FIG. 3D.

A third step in producing the two phase states of the modulator entails providing the required delay to the phasor Q$_o$ for symmetry with the phasors I$_3$/J$_3$ when they are summed in the hybrid HY$_3$ to form two equal amplitude output phasors of the two state phase modulator.

The quadrature phase component Q$_o$ appearing at the D port of hybrid HY$_2$, represented by a phasor of unit length in FIG. 3A, is subjected to a delay of approximately 25°, set in relation to the phasors, I$_3$ and J$_3$. After passage through the delay line DL$_2$ the phasor, which is illustrated in FIG. 3C, is denominated "Q$_1$". Should the phasor Q$_1$ from FIG. 3C be superimposed on the axis of FIG. 3D, it would bisect the angle between J$_3$ and I$_3$.

The output of the phase modulator is formed in the hybrid HY$_3$ from the phasors Q$_1$, I$_3$ and J$_3$. The hybrid HY$_3$ may be a quadrature hybrid like HY$_1$ and HY$_2$, or an in-phase hybrid. In either event, the hybrid is connected for power summation. Using the quadrature hybrid notations, the phasor Q$_1$ derived from the delay line DL$_2$ is coupled to the C port, and the phasor I$_3$/J$_3$ derived from the attenuator ATT$_2$ is coupled to the D port. The A port (not shown) is terminated, and the summed phasors defining the two phase output states appear at the B port which is coupled to the output terminal P$_2$ of the phase modulator. The connections for using an in-phase hybrid are interchangeable between the input ports, and the terminated port may not be accessible.

When the delay DL$_2$ has the proper value, the phasors for the in-phase hybrid will be related as shown in FIG. 3E. Neither the in-phase hybrid which is illustrated, nor the quadrature hybrid combine phasors Q$_1$, I$_3$, and J$_3$ efficiently. More power will be dissipated in the termination for the isolation port than is transmitted to the output. However, the additional insertion loss is of little concern. For Θ=30° as in FIG. 3E, the voltage ratio will be 0.876/0.707 and it will be exactly the same for either the in-phase or the quadrature hybrid. For the in-phase hybrid the Q$_1$ phasor must be delayed by DL$_2$ by Θ/4 degrees and in the quadrature hybrid Q$_1$ must be delayed by 90°+Θ/4 degrees. In either hybrid the output having the smaller amplitude is used to keep the phasors on the circumference of a circle. For the in-phase hybrid this connection can be confirmed by reversing the input terminals, while for the quadrature hybrid, the output from the opposite terminal can be used.

A graphical representative of the summation process where the in-phase hybrid is used is provided in the FIG. 3E phasor diagram. Here all vectors have been rotated an additional 10° to account for delay in the connecting wiring. The graph further illustrates the reduction in amplitude modulation as the modulator switches between the two phase output states. During the "one bit" when the switch SW$_1$ makes contact with terminal RF$_1$, the phasor I$_3$ is supplied to the D port of hybrid HY$_3$. Throughout the operation of the modulator, the Q$_1$ phasor is supplied to the C port. The two phasors are not in quadrature for exact summation in the hybrid, but approximate addition takes place to form a resultant Q$_3$. The effect of adjusting the magnitude of I$_3$ to the 2 sin Θ/2 value done in attenuator ATT$_2$, is to bring the phasors (Q$_1$, I$_3$, Q$_3$) into the relation of sides of an isosceles triangle, in which the central angle is 30° and the equal angles are each 75°. Under these conditions, Q$_3$ equals Q$_1$.

Similarly during the "zero" bits when the SW₁ makes contact with terminal RF₂, the phasor $J_3$ is supplied to the D port of hybrid HY₃. Since the phasor $J_3$ is of equal length to the phasor $I_3$, and also make an angle of 75° to the phasor $Q_1$, a second isosceles triangle is created by the phasors ($Q_1$, $J_3$, $Q_2$). The resultant $Q_2$ is the phasor for the 0 state, and its phase differs from $Q_3$ by 60°. Under these conditions $Q_2$ equals $Q_1$.

Thus when the phase modulator is in operation, the magnitude of the output of the phase modulator may be represented by phasors $Q_1$, $Q_2$ and $Q_3$. When the switch SW₁ is in the "one" state, the phasor $Q_3$ represents the output of the phase modulator at +30° from reference phase. When the switch is in the "zero" state, the phasor $Q_2$ represents the output of the phase modulator at −30° from reference phase. The sequence of phase resultants $Q_1$, $Q_2$, and $Q_3$ will always be $Q_3$, $Q_1$, to $Q_2$ or as the sequence is reversed $Q_2$, $Q_1$ to $Q_3$. In this sequence $Q_3$ corresponds to 30°, $Q_2$ corresponds to −30°, and $Q_1$ corresponds to 0° in a momentary position between $Q_3$ and $Q_2$ where $I_3$ and $J_3$ are in a transitory state.

When switching occurs between states, the quantity $Q_1$, which is always being fed to the summation hybrid and which is of equal magnitude to $Q_2$ or $Q_3$, permits only a very small ripple, representable by two valleys to either side of the unit vector $Q_1$, during the transition between states.

Using the phasor relationships illustrated in FIG. 3E, the amplitude modulation or ripple of the FIG. 1 embodiment, assuming that Q is 60°, may be read from the graph or calculated from geometrical considerations.

When the quadrature hybrid is installed, the phasor $Q_1$ must be rotated an additional 90° to provide the proper input. The phasor diagram corresponding to FIG. 3E with this hybrid will be rotated 90° clockwise and show the same summation of phasors.

In the graph of FIG. 3E, the ripple is represented by the difference between the distance from the origin to the circumference of the circle and the distance from the origin to the center of the applicable chord. Assuming the above conditions, the points a, b and c are at the tips of the three pertinent phasors, and the chords connecting a and b, and connecting b and c are the applicable chords. The distances in FIG. 3E representing the resulting ripple are thus the differences between the lines $R_3$ and $Q_1$ and between $R_2$ and $Q_1$. At the center of the transition there is no ripple since $Q_1$ is a unit phasor equal to $Q_2$ and $Q_3$.

Numerically the relationship between $R_1$, $R_2$ and $R_3$ and $Q_1$ are cosines of the appropriate angles:

$$|R_1/Q_1| = \cos \Theta/2 \text{ (e.g. 30°, 22.5°)}$$

$$|R_3/Q_1| = |R_2/Q_1| \cos \Theta/4 \text{ (e.g. 15°, 11.25°)}$$

The numerical ratio representing the ripple ratio for the $\Theta = 60°$ example is 0.966 and in dB, −0.301 dB. Should the angle $\Theta$ be reduced to 45° (and the frequency multiplication increased from 3 to 4 to obtain ±90° phase shifts), the numerical ratio representing the ripple ratio is 0.981 and in dB, −0.169 dB.

The ripple, assuming that one only supplies $Q_2$ and $Q_3$, which is the prior art approach, is represented by the distance between the chord a c and the arc. The distance representing the ripple in the prior art approach is thus the difference between $Q_1$ and $R_1$. With a phase angle $\Theta$ of 60° the ripple ratio is 0.866, and in dB, −1.25 dB. The ripple performance is improved by a factor of four by use of the sustained phasor $Q_1$, supplied to the summation hybrid HY₃. With a phase angle $\Theta$ of 45°, the ripple ratio for the prior art approach is 0.924, and in db −0.688 dB. Here also the ripple performance is improved by a factor of four by use of the sustained phasor $Q_1$ supplied to the summation hybrid HY₃.

The ripple present in prior art arrangements is well known. In a practical case where a phase modulation of ±90° is directly obtained an amplitude reduction in the transition of 23 dB is typical. Where the phase modulation is reduced to ±25°, the amplitude reduction falls to 0.6 dB. The use of the sustained phasor would reduce these ripples substantially.

The foregoing approach represents a first order correction. An equal ripple correction illustrated in FIG. 4 may be preferable, if an increase in the peak value of the phasor is acceptable. Assuming that an equal ripple approach is used, which is achieved by increasing the length of phasor $Q_1$ to ($Q_1 + \delta$) in relation to $Q_2$ and $Q_3$ ($Q_1$, $Q_2$ and $Q_3$ all previously being treated as unit phasors). The increase is to the amount required to equalize the excess "$\delta$" of phasor ($Q_1 + \delta$) to the excess (also "$\delta$") of the phasors $Q_2$ or $Q_3$ over the newly drawn line H, now a secant. The new secant H is drawn between $Q_2$ or $Q_3$ and $Q_1 + \delta$. The ripple "$\delta$", drawn to the secant, equals $R_4 - Q_1$. The calculated improvement in ripple is the ratio between $R_4/Q_1 = 20 \log_{10} (1 - \delta/Q_1)$. In the case of $\Theta = 60°$, the ripple ratio is reduced to 0.976, or in dB −0.208 dB representing a 0.1 dB improvement in ripple over the corresponding first order correction, and in the case of $\Theta = 45°$ the ripple ratio is reduced to 0.987 or in dB −0.116 dB, representing an 0.05 dB improvement over the corresponding first order correction.

The relationships for calculating the performance of an equal ripple adjustment, using the graph of FIG. 4, may be derived in the following manner.

$$\Theta/2 = \beta + \beta + \alpha$$

$$Q - \delta = Q \cos \beta$$

$$\therefore \beta = \cos^{-1} (1 - \delta/Q)$$

$$Q - \delta = (Q + \delta) \cos (\alpha + \beta)$$

$$\therefore \alpha + \beta = \cos^{-1} (1 - \delta/Q)/(1 + \delta/Q)$$

$$\Theta/2 = \cos^{-1} (1 - \delta/Q) + \cos^{-1} (1 - \delta/Q)/(1 + \delta/Q)$$

If we solve for $\delta/Q$ knowing $\Theta$ (e.g. 60°, 45°), then:

$$R_4/Q = 1 - \delta/Q, \text{ or}$$

$$R_4/Q = 20 \log_{10} (1 - \delta/Q).$$

The phasors Q, $Q + \delta$ and H (the secant) must then close. The closure may require a small angular readjustment of the component phasors $I_3$ or $J_3$ making up $Q_2$ and $Q_3$.

The switch SW₁ may take the form of a GaAs SPDT MMIC switch, for instance model SW-233 or SW-236 by the Adams Russell Components Group. The indicated switch contains an internal drive circuit. One may also use a GaAs switch requiring an external drive circuit.

In addition, the attenuator ATT₂ which follows the switch SW₁, may combine a limiting amplifier and additional attenuation so as to bring the nominal net gain to −7 dB. The limiting amplifier may be used to further reduce small differences between the waves $I_2$ and $J_2$, and to further reduce the dip which normally occurs as the switch $SW_1$ goes from one state to the other. The limiting amplifier design must avoid the creation of spurious signals and must not introduce phase distortion.

Instead of a GaAs MMIC switch one may use a dc switched double balanced modulator, in which the switch position is controlled by the polarity of an applied dc bias voltage. This variety normally uses diodes in a ring configuration.

What is claimed is:

1. A phase modulator for switching between two phase states by a differential angle $\Theta$ with minimum amplitude modulation, comprising:

A) an input terminal for connection to a source of carrier waves,

B) a first quadrature hybrid connected for power division having the input port connected to said input terminal, and a first output port producing a wave substantially at reference phase (0°) and a second output port producing a wave substantially in quadrature (−90°) to said reference phase, C) a second quadrature hybrid connected for power division having the input port coupled to said second output port of said first hybrid, and a first output port producing a wave ($Q_o$) substantially in quadrature (−90°) with said reference phase, and a second output port producing an output wave ($J_o$) substantially out of phase (−180°) with said reference phase;

D) a first attenuator connected to said first output port of said first hybrid for deriving at its output an attenuated wave ($I_o$) at reference phase and substantially equal in magnitude to waves ($J_o$) and ($Q_o$);

E) a solid state single pole double throw switch having a first and a second terminal, and a common terminal selectively connected to said first or second terminals in response to a control signal, said first terminal being connected to the output of said first attenuator;

F) a first delay line connected to said second output port of said second hybrid for coupling a wave to said second switch terminal, delayed in relation to the wave ($I_2$) at said first switch terminal by an angle of (−180°−$\Theta$/2), operation of said switch causing alternate transmission of the waves ($I_2$) and ($J_2$) to said common switch terminal, G) a second attenuator connected to said common switch terminal for deriving from said switch selected waves ($I_2$), ($J_2$), corresponding attenuated waves ($I_3$), ($J_3$) at its output, respectively, each reduced from equality with ($Q_o$) by a factor of approximately (2 sin $\Theta$/2), H) a second delay line connected to said first output port of said second hybrid for deriving from wave ($Q_o$), a delayed wave ($Q_1$) at its output, at a phase related to the phases of waves ($I_3$) and ($J_3$) to effect equal magnitude resultants when, in one switch state, the waves ($Q_1$) and ($J_3$) are summed in a summation hybrid to form a resultant wave ($Q_2$), and when, in the other switch state, the waves ($Q_1$) and ($I_3$) are summed to form a resultant wave ($Q_3$), and I) a third hybrid connected for power summation having a first input port, coupled to the output of said second delay line and a second input port coupled to the output of the second attenuator and an output port at which the waves ($Q_2$), ($Q_1$), and ($Q_3$) appear, the wave $Q_1$ always present at input port (C) being approximately equal to the magnitudes of resultant waves ($Q_2$) and ($Q_3$) to prevent the output waveform from falling significantly in the transition between the first and second phase states.

2. The phase modulator set forth in claim 1 wherein said attenuation factor in said second attenuator is equal to 2 sin $\Theta$/2 to effect equality between said waves $Q_1$, $Q_2$ and $Q_3$, the phasors of the respective waves $Q_2$ and $Q_1$ and the phasors of the respective waves of $Q_1$ and $Q_3$ forming equal legs of two isosceles triangles the central angle of which is equal to $\Theta$/2, to effect a first order correction in which the amplitude modulation is substantially equal to:

$$Q_1 (1 - \cos \Theta/4).$$

3. The phase modulator set forth in claim 1 wherein said attenuation factor in said second attenuator is made to exceed 2 sin $\Theta$/2 to cause $Q_1$ to exceed $Q_2$ and $Q_3$ by an increment $\delta$, the vectors $I_3$ and $J_3$ each being redirected to form a secant between $Q_2$ and ($Q_1+\delta$) and a secant between $Q_3$ and ($Q_1+\delta$) whose greatest distance below an arc of radius $Q_1$ is also equal to an increment $\delta$ to form an equal ripple amplitude variation.

4. A phase modulator for switching between two phase states by a differential angle $\Theta$ with minimum amplitude modulation comprising A) an input terminal for connection to a source of carrier waves, B) means for dividing the waves coupled to said input terminal into three waves of equal magnitude: $I_o$ at reference phase (0°), $J_o$ out of phase (−180°) and $Q_o$ in quadrature (−90°), C) means for delaying the out of phase wave in relation to the wave at reference phase by the angle $\Theta$/2, D) selective attenuation means to alternately select the delayed out of phase wave or the wave at reference phase for attenuation by a factor approximately equal to 2 sin $\Theta$/2, E) means to delay the quadrature phase wave by the angle required to effect equal magnitude resultants when in one selection state, the selected wave and said delayed quadrature wave are summed and when in the other selection state, the other selected wave and said delayed quadrature wave are summed, each resultant being of approximately equal magnitude to said delayed quadrature wave, and F) summation means for summing the output of said delay means and the output of said selective attenuation means for producing output waves successively of one phase from one resultant of intermediate phase, from the delayed quadrature wave during the transition to the other phase state, and of the other phase from the other resultant, said delayed quadrature wave sustaining the magnitude of the output waveform during said transition.

5. The phase modulator set forth in claim 4 wherein said selected wave, when summed with said delayed quadrature wave to form a resultant wave, the phasors represented form an isosceles triangle with equal sides, and a central angle of $\Theta/2$, to achieve a first order correction.

6. The phase modulator set forth in claim 5 wherein said summation means is an in-phase hybrid, and
said means to delay said quadrature phase wave effects a delay of $\Theta/4$ in relation to said selected reference phase wave.

7. The phase modulator set forth in claim 5 wherein said summation means is a quadrature phase hybrid, and
said means to delay said quadrature phase wave effects a delay of $(90° + \Theta/4)$ in relation to said selected reference phase wave.

8. The phase modulator set forth in claim 4 wherein said attenuation factor is made to exceed $2 \sin \Theta/2$ to cause the magnitude of the quadrature wave Q to exceed the magnitude of the two resultant waves by an increment $\delta$, the selected waves each being redirected to form a secant between one resultant and the incremented quadrature wave $(Q+\delta)$ and between the other resultant and the incremented quadrature wave $(Q+\delta)$ whose greatest distance below an arc of radius Q is also equal to the increment $\delta$ to form an equal ripple amplitude variation.

9. The phase modulator set forth in claim 4 wherein said differential angle $\Theta$ is selected to be a sub-multiple of 180° for convenient multiplication of the frequency of the carrier waves to effect bi-phase operation within a 180° phase difference between states.

* * * * *